(12) United States Patent
Shen et al.

(10) Patent No.: US 9,425,100 B1
(45) Date of Patent: Aug. 23, 2016

(54) METHODS OF FACILITATING FABRICATING TRANSISTORS

(71) Applicant: GLOBALFOUNDRIES Inc., Grand Cayman (KY)

(72) Inventors: Zhaoxu Shen, Clifton Park, NY (US); Min-hwa Chi, Malta, NY (US); Haiting Wang, Clifton Park, NY (US); Qin Wang, Ballston Spa, NY (US); Meixiong Zhao, Ballston Lake, NY (US); Duohui Bei, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/694,276

(22) Filed: Apr. 23, 2015

(51) Int. Cl.
| | |
|---|---|
| *H01L 21/00* | (2006.01) |
| *H01L 21/8234* | (2006.01) |
| *H01L 27/088* | (2006.01) |
| *H01L 21/306* | (2006.01) |
| *H01L 29/06* | (2006.01) |
| *H01L 29/10* | (2006.01) |
| *H01L 21/308* | (2006.01) |

(52) U.S. Cl.
CPC .... *H01L 21/823412* (2013.01); *H01L 21/3081* (2013.01); *H01L 21/30604* (2013.01); *H01L 21/823437* (2013.01); *H01L 21/823481* (2013.01); *H01L 27/088* (2013.01); *H01L 29/0649* (2013.01); *H01L 29/1033* (2013.01)

(58) Field of Classification Search
CPC ................ H01L 21/3043; H01L 21/76202
USPC ............ 438/42, 43, 337, 361, 424, 426, 427, 438/576
See application file for complete search history.

(56) References Cited

U.S. PATENT DOCUMENTS

| | | | | |
|---|---|---|---|---|
| 4,778,583 A | * | 10/1988 | Wagner et al. ...... | H01L 21/3065 204/192.37 |
| 7,564,105 B2 | | 7/2009 | Chi et al. | |
| 7,838,355 B2 | * | 11/2010 | Anderson et al. . | H01L 29/66795 257/E21.633 |
| 8,461,634 B2 | | 6/2013 | Yang et al. | |
| 8,975,703 B2 | * | 3/2015 | Gan et al. ............. | H01L 27/092 257/368 |
| 2015/0194503 A1 | * | 7/2015 | Ching et al. ........ | H01L 29/7856 438/283 |

* cited by examiner

*Primary Examiner* — Tan N Tran
(74) *Attorney, Agent, or Firm* — Heslin Rothenberg Farley and Mesiti PC; Nicholas Mesiti

(57) ABSTRACT

Methods and transistors for circuit structures are provided. The methods include, for instance: defining a channel region in a substrate, the channel region having at least one channel region sidewall adjoining an isolation material; recessing the isolation material to expose an upper portion of the at least one channel region sidewall; and providing a gate structure over a gate interface area with the channel region. The gate interface area includes at least the upper portion of the at least one channel region sidewall and an upper surface of the channel region so that a threshold voltage of the gate structure may be reduced. The methods may also include etching an elongate notch in the upper portion of the at least one channel region sidewall to increase a size of the gate interface area and further reduce the threshold voltage of the gate structure.

14 Claims, 7 Drawing Sheets

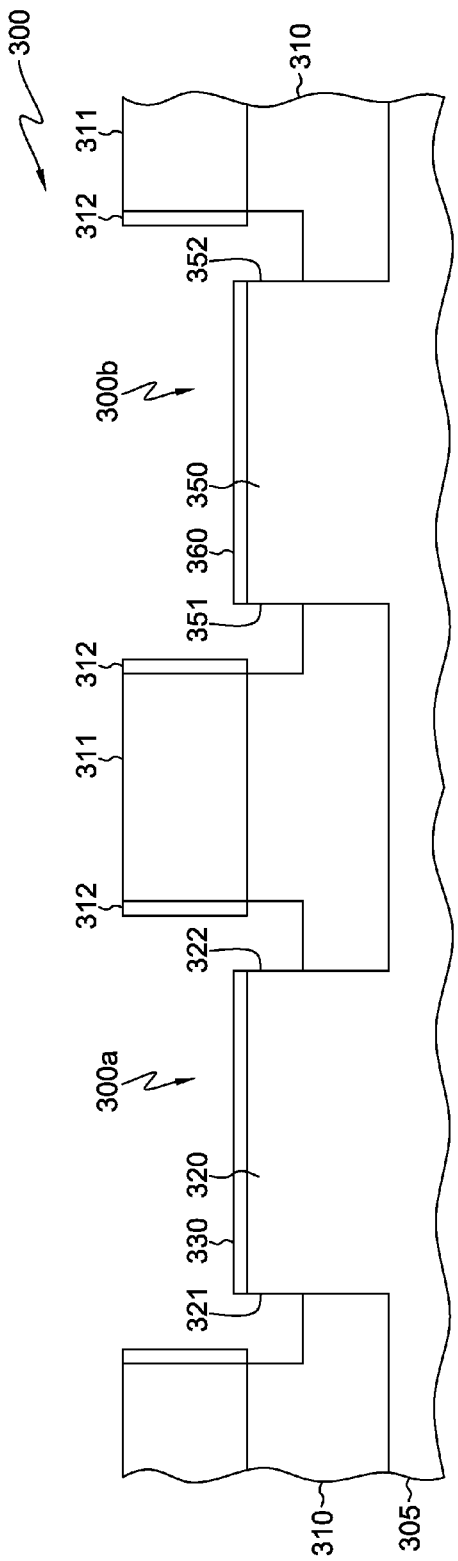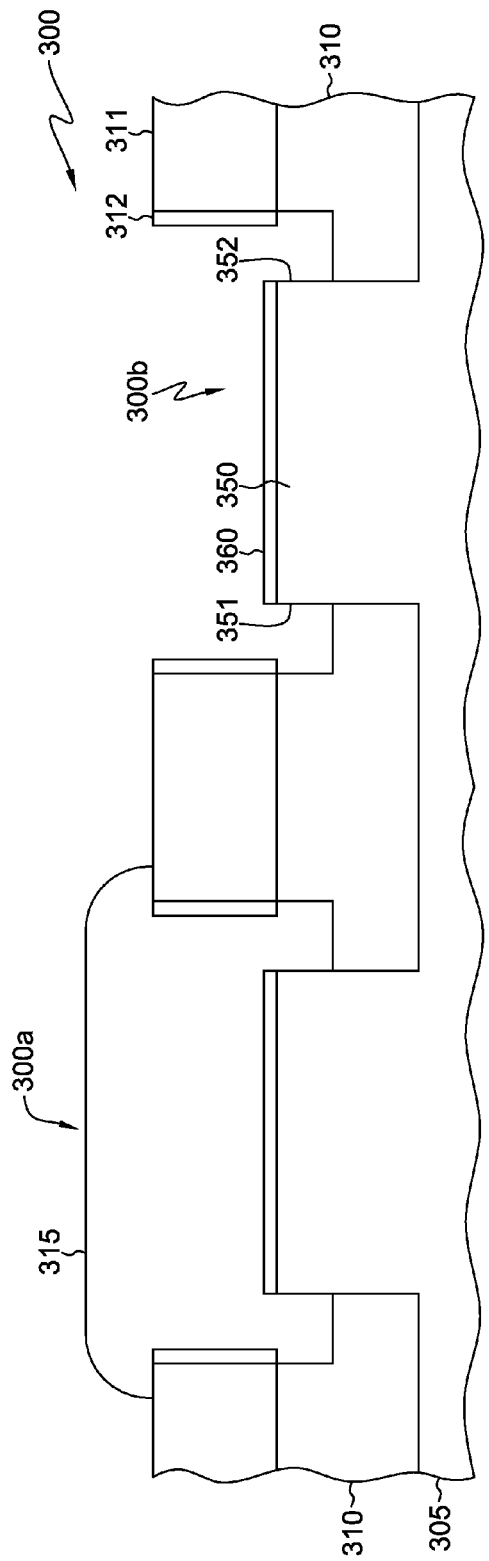

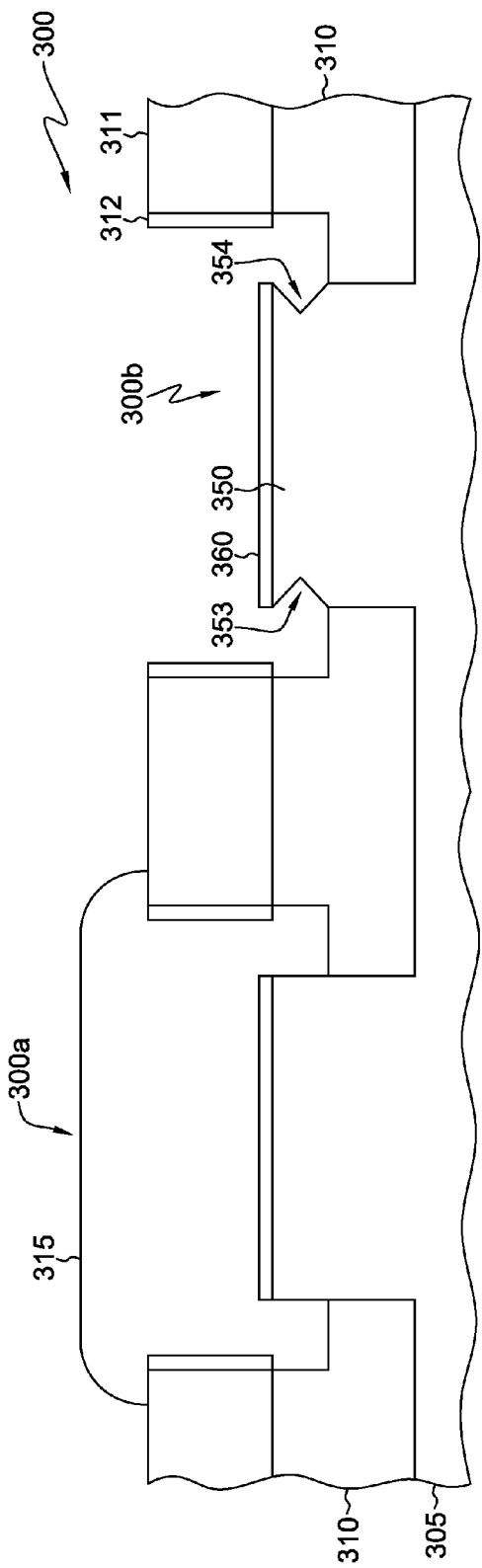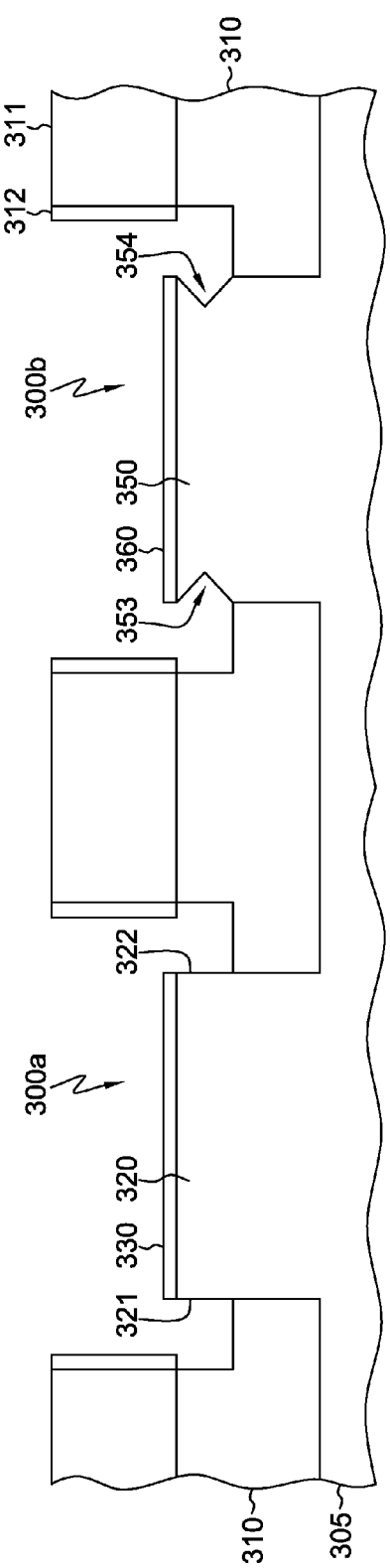

METHODS OF FACILITATING FABRICATING TRANSISTORS

FIELD OF THE INVENTION

The present invention generally relates to fabricating circuit structures, and more specifically, to transistors and methods of fabricating thereof.

BACKGROUND OF THE INVENTION

Planar complementary metal-oxide silicon (CMOS) transistors may be desirable in circuit structures for many reasons. Such transistors may, for example, provide fully depleted planar devices, superior short channel control, low junction leakage current, and other advantages. As circuit structure sizes continue to shrink, scaling of CMOS transistors to smaller sizes may require novel fabrication techniques to achieve expected high performance levels without losing the advantages of the planar transistor architecture.

BRIEF SUMMARY

Various shortcomings of the prior art are overcome, and additional advantages are provided through the provision, in one aspect, of a method which includes facilitating fabricating a transistor, the facilitating fabricating including: defining a channel region in a substrate, the channel region having at least one channel region sidewall adjoining an isolation material; recessing the isolation material, the recessing exposing an upper portion of the at least one channel region sidewall; providing a gate structure over a gate interface area with the channel region, the gate interface area including at least the upper portion of the at least one channel region sidewall and an upper surface of the channel region; and, wherein the gate interface area comprising the upper portion of the at least one channel region sidewall reduces a threshold voltage of the gate structure.

In another aspect, also provided is a structure including a substrate and at least one transistor over the substrate, the at least one transistor including: a channel region defined in the substrate; a gate structure over the a gate interface area of the channel region, wherein the gate interface area comprises at least an upper surface of the channel region and an portion of at least one channel region sidewall; and, wherein the gate interface area comprising the upper portion of the at least one channel region sidewall reduces a threshold voltage of the gate structure.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1A:
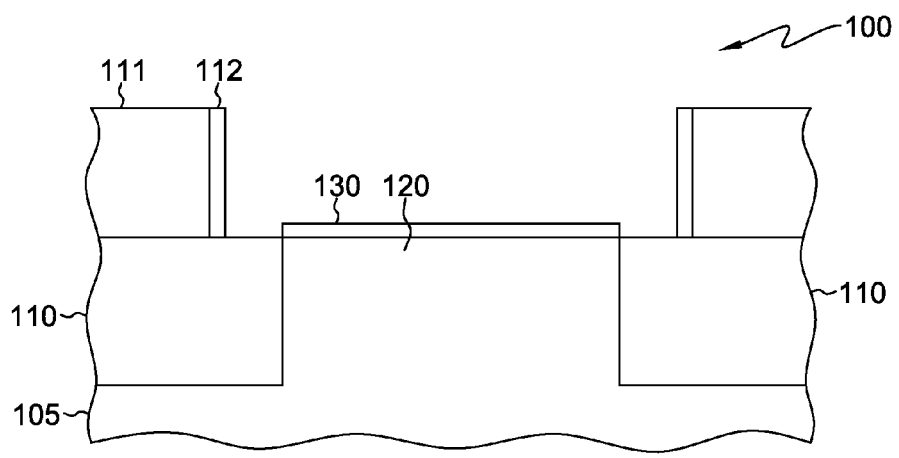
FIGS. 1A-1D depict one embodiment of a process for facilitating fabricating a transistor having a gate interface area that includes an upper portion of at least one channel region sidewall, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Complementary metal-oxide silicon (CMOS) transistors having a planar architecture continue to be important to many circuit structures, such as SRAM and logic circuits, as such transistors may advantageously provide high-performance fully-depleted devices while also providing good short-channel control and minimizing junction leakage current, among other advantages. As transistors continue to become smaller, however, planar transistor device performance may degrade due, in part, to the reduced gate interface area between transistor gate structures and planar channel regions resulting from a narrower channel region width, as well as increased variability in transistor formation at smaller dimensions. For example, the threshold or minimum voltage that must be applied to the gate structure to induce current flow in the channel region may, in large part, be determined by the size of the gate interface area with the channel region; as channel regions become narrower, the gate interface area also shrinks and threshold voltages may remain undesirably high. Consequently, the current carrying capability of the transistor may decrease as channel regions and gate interface areas shrink without a commensurate reduction in threshold voltages. These problems may be compounded by fabrication variation among connected transistor structures, as the threshold voltage applied to related transistors may be set to match the highest threshold voltage among such transistor structures. Threshold voltage variations among transistors may become increasingly sensitive to variations in channel region sizes as channel region sizes shrink, so that even small variations in channel region formation (i.e., variations in channel region length or width) may result in comparatively large threshold voltage variations. Techniques for increasing the size of the gate interface area of planar transistors, without also affecting the size of the planar transistors or of other components of the planar transistors, may resolve one or more of these issues.

Thus, generally stated, disclosed herein is a method which includes facilitating fabricating a transistor, the facilitating fabricating including: defining a channel region in a substrate, the channel region having at least one channel region sidewall adjoining an isolation material; recessing the isolation material, the recessing exposing an upper portion of the at least one channel region sidewall; providing a gate structure over a gate interface area with the channel region, the gate interface area including at least the upper portion of the at least one channel region sidewall and an upper surface of the channel region; and, wherein the gate interface area including the upper portion of the at least one channel region sidewall reduces a threshold voltage of the gate structure. In one exemplary embodiment, the method may also include forming an elongate notch in the upper portion of the at least one channel region sidewall, so that the elongate notch increases a surface area of the at least one channel region sidewall and further reduce the threshold voltage of the gate structure.

Also disclosed herein, in another aspect, is a structure including a substrate and at least one transistor over the substrate, the at least one transistor including: a channel region defined in the substrate; a gate structure over the a gate interface area of the channel region, wherein the gate interface area includes at least an upper surface of the channel region and an portion of at least one channel region sidewall; and, wherein the gate interface area including the upper portion of the at least one channel region sidewall reduces a threshold voltage of the gate structure.

Reference is made below to the drawings, which are not drawn to scale for ease of understanding, wherein the same reference numbers used throughout different figures designate the same or similar components.

FIGS. 1A-1D depict one embodiment of a process for facilitating fabricating a transistor, resulting in a gate interface area between a gate structure and channel region that includes the upper portion of at least one channel region sidewall so as to reduce a threshold voltage of the gate structure. FIG. 1A depicts a cross-section of one embodiment of a structure 100 including a substrate 105 and a channel region 120 defined in the substrate. Channel region 120 may be a channel region for a planar transistor. Channel region 120 may be defined, for example, by an etching process that etches isolation trenches in substrate 105 on either side of channel region 120, the isolation trenches then filled with an isolation material 110. In exemplary embodiments, substrate 105 and channel region 120 may be a silicon material such as polycrystalline silicon, and may have a crystalline silicon structure. Isolation material 110 may, ideally, be an oxide material such as silicon oxide. Channel region 120 may have at least one channel region sidewall adjoining isolation material 110. In exemplary embodiments, as illustrated in FIG. 1A and following figures, channel region 120 may have a first channel region sidewall and a second channel region sidewall, with the first channel region sidewall adjoining a first portion of isolation material 110 and the second channel region sidewall adjoining a second portion of isolation material 110.

In at least one embodiment, when channel region 120 has been defined in substrate 105, structure 100 may undergo subsequent processing to form a temporary gate structure over channel region 100 and to remove a portion of the temporary gate structure, such as a sacrificial material, to expose the isolation material 110 and/or channel region 120 for further processing. FIG. 1A depicts an embodiment in which a portion of the temporary gate structure, such as a poly-crystalline sacrificial material, has been selectively removed to leave behind insulating material 111 and spacer material 112 over portions of isolation material 110, as well as a masking material 130 over the upper surface of channel structure 120. In one example, insulating material 111 may include an oxide material and spacer material 112 may include a nitride material. Masking material 130 may, for example, be a gate oxide layer provide over channel region 120 prior to providing a replacement gate material over masking material 130. The selective removal of the sacrificial material may remove little or no part of masking material 130, so that masking material 130 protects channel region 120 from being damaged during removal of the replacement gate material.

Figure 1B:
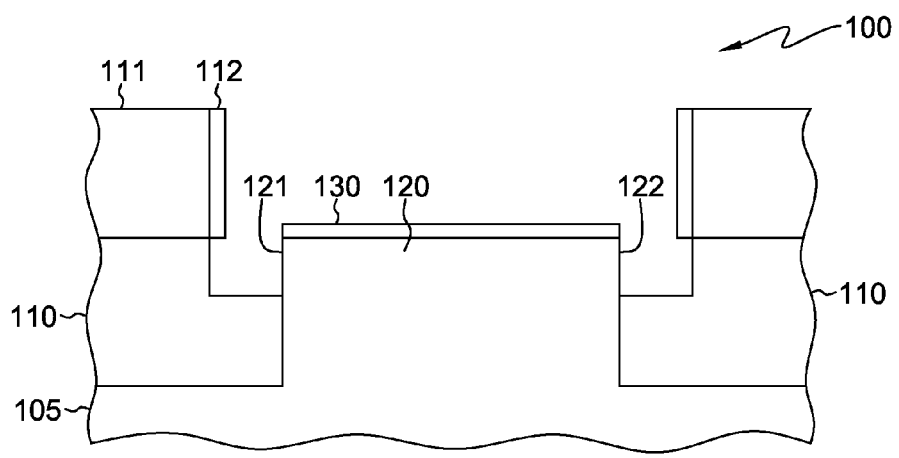

FIG. 1B depicts structure 100 of FIG. 1A following recessing of isolation material 110 to expose an upper portion of the at least one channel region sidewall 121. The recessing of isolation material 110 may recess the first portion and second portion of isolation material 110 to expose an upper portion of first channel region sidewall 121 and expose an upper portion of second channel region sidewall 122. In exemplary embodiments in which the isolation material 110 includes an oxide compound, the recessing may include using an isotropic etchant that selectively etches or recesses oxide compounds without affecting other materials, such as, for instance, nitride compounds in spacers 112 and silicon in channel region 120. For example, the isotropic etchant may be a wet oxide etchant, such as hydrofluoric acid (HF) or buffered hydrofluoric acid (BHF). The recession of isolation material 110 may be controlled to recess isolation material 110 by about 5 nm to about 10 nm, exposing a corresponding upper portion of first channel region sidewall 121 and second channel region sidewall 122. For example, the recession may be controlled by controlling an exposure time of structure 100 to a wet oxide etchant.

In exemplary embodiments in which masking material 130 includes an oxide compound, such as a gate oxide layer, the recessing of isolation material 110 may also partially or entirely remove masking material 130 from over channel region 120. In embodiments in which the recessing of isolation material 110 does not fully remove masking layer 130, an additional etching process may be used to remove the remaining portion of masking layer 130 to fully expose the upper surface of channel region 120. In one alternative embodiment, at least a portion of masking material 130 may remain over channel region 120, and in such alternative embodiments the remaining portion of masking material 130 may function, in part, as at least one interface layer between channel region 120 and a replacement metal gate (RMG) structure formed in subsequent processing. However, masking material 130 may ideally be completely removed from over channel region 120 to allow for provision of the at least one interface layer, as masking material 130 may not provide an ideal interface layer for a completed transistor.

Figure 1C:
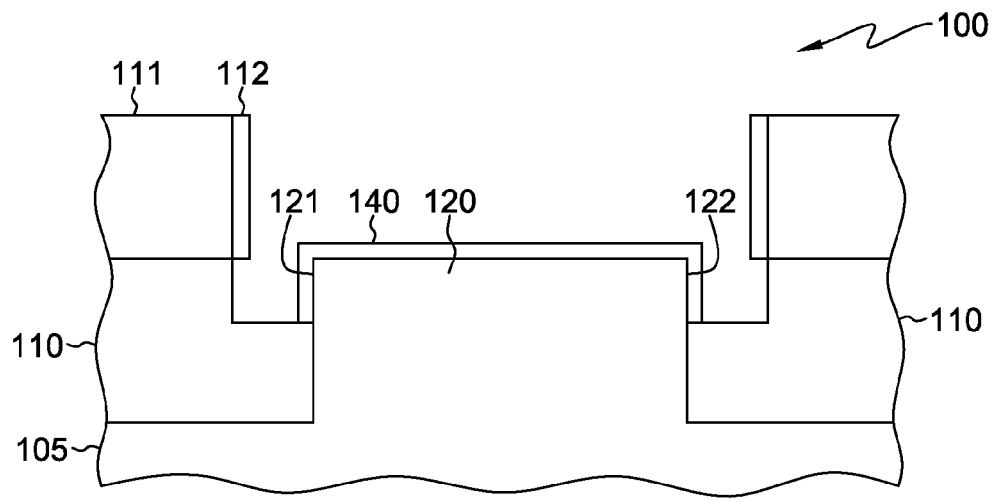

FIG. 1C depicts structure 100 of FIG. 1B following provision of at least one interface layer 140, as a gate dielectric layer, over channel region 120. The at least one interface layer 140 may be provided over the upper surface of channel region 120 and the at least one upper portion of channel region sidewall 121. In exemplary embodiments the at least one interface layer 140 is provided over the upper portion of first channel region sidewall 121 and second channel region sidewall 122 as depicted in FIG. 1C. The at least one interface layer 140 may be provided, for example, via a controlled oxidation process that uniformly oxidizes the upper surface of channel region 120 and the first channel region sidewall 121 and second channel region sidewall 122. For example, the controlled oxidation process may include exposing structure 100 to an oxygen-containing compound in a non-oxidizing environment, so that oxidation occurs only via interaction between the material of channel region 120 and the oxygen-containing compound without additional oxidation occurring due to interactions between the material of channel region 120 and gaseous oxygen. Other methods, such as atomic layer deposition of an interface layer compound, may also or alternatively be used to form at least one interface layer 140.

Additional interface layers 140 may also be provided, such as one or more interface material layers having a high dielectric constant (high-k materials), dependent on the specific type or purpose of transistor being fabricated.

Figure 1D:
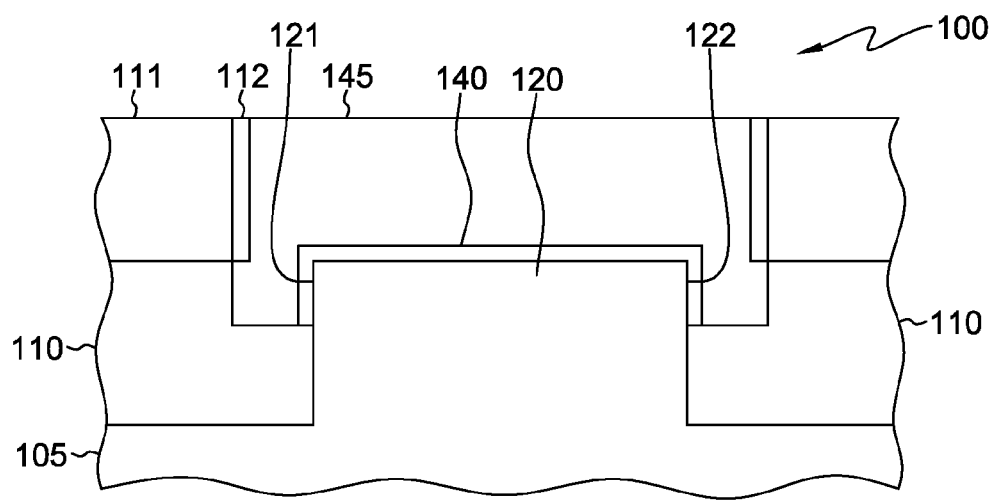

FIG. 1D depicts structure 100 of FIG. 1C following provision of a gate structure 145, such as a replacement metal gate (RMG) structure, over a gate interface area with channel region 120. The gate interface area with channel region 120 includes at least the upper portion of the at least one channel region sidewall 121 and an upper surface of channel region 120. In exemplary embodiments the gate interface area may include the first channel region sidewall 121 and second channel region sidewall 122, as well as the upper surface of channel region 120. Gate structure 145 may include a gate metal, and in some embodiments may include a plurality of gate materials, such as work-function layers, capping layers, conductive metal layers, and so on. For simplicity, the embodiment of FIG. 1D depicts gate structure 145 as being represented by a single gate structure layer. Gate structure 145 may contact the at least one interface layer 140, as depicted in the embodiment of FIG. 1D, or may contact one interface layer of a plurality of interface layers 140 over channel region 120.

The inclusion of the upper portion of the at least one channel region sidewall 121 in the gate interface area, or the inclusion of both upper portion of first channel region sidewall 121 and second channel region sidewall 122 in the gate interface area, may effectively reduce a threshold voltage of gate structure 145. As discussed herein, the threshold voltage of a gate structure in a transistor may, in part, depend on the size of a gate interface area with a channel region of the transistor. Including the upper portion of the at least one channel region sidewall 121 with the upper surface of channel region 120 may effectively increase the channel width of the gate interface area with gate structure 145 without affecting the physical width of channel region 120, advantageously allowing for greater current flow through the channel region with both improved device performance and small lateral device size. In exemplary embodiments, channel region 120 may adjoin source and drain regions (not depicted), and the processes described herein may advantageously increase the gate interface area between gate structure 145 and channel region 120 without affecting or changing the properties of the source and drain regions. For example, source and drain regions may be protected by a material similar to insulating material 111 and/or spacer material 112 over the source/drain regions, as well as adjoining isolation materials, so that the recessing of isolation material 110, as described herein, may not similarly recess isolation materials adjoining the source and drain regions.

In exemplary embodiments in which structure 100 of FIG. 1D is one transistor of a plurality of transistors, reducing the threshold voltage of gate structure 145 of the one transistor may also effectively reduce a threshold voltage differential between the one transistor and at least one other transistor of the plurality of transistors. The inclusion of the upper portion of at least one channel region sidewall 121 in the gate interface area may, for example, compensate for variations in size between channel regions in a plurality of transistors. Reducing the threshold voltage differential between the one transistor and the at least one other transistor of the plurality of transistors may also effectively reduce a minimum threshold voltage for the plurality of transistors and enhance the performance or speed of circuit structures. This may allow for the plurality of transistors to be operated at a lower voltage overall, reducing junction leakage and energy waste for the plurality of transistors.

Figure 2A:
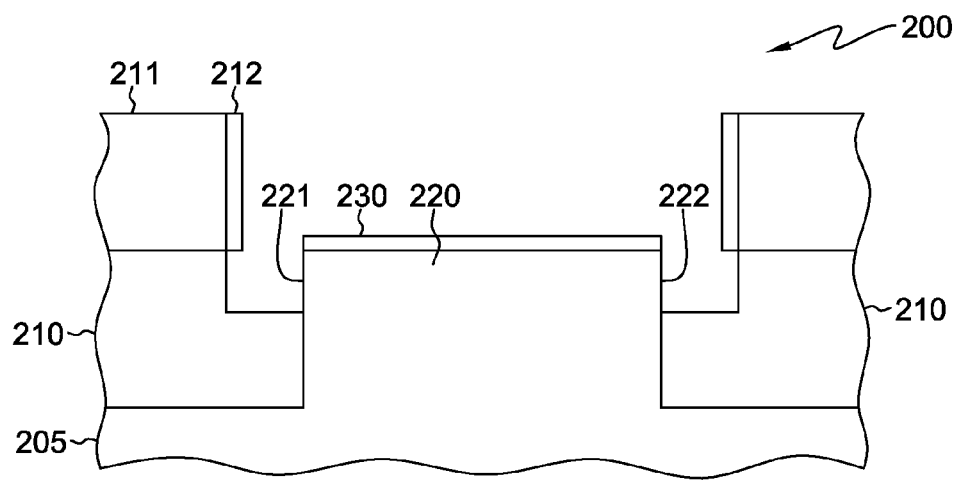
FIGS. 2A-2E depict another embodiment of a process for facilitating fabricating a transistor having a gate interface area that includes an elongate notch in an upper portion of at least one channel region sidewall, in accordance with one or more aspects of the present invention; and, FIGS. 3A-3D depict one embodiment of at least a part of a process for facilitating fabricating a plurality of transistors, in which the plurality of transistors have reduced threshold voltages and reduced threshold voltage differentials between the plurality of transistors, in accordance with one or more aspects of the present invention.

FIGS. 2A-2E depict another embodiment of a process for facilitating fabricating a transistor. FIG. 2A depicts a structure 200 similar to the structure depicted in FIG. 1B following recessing of isolation material 210 to expose an upper portion of at least one channel region sidewall 221 of channel region 220, above substrate 205 and adjacent spacer 212 and insulating material 211. The recessing of isolation material 210 may expose an upper portion of first channel region sidewall 221 and an upper portion of second channel region sidewall 222. As described above, in embodiments in which isolation material 210 includes an oxide compound, the recessing may include an isotropic recessing process using a wet oxide etchant, such as hydrofluoric acid (HF) or buffered hydrofluoric acid (BHF), that may selectively etch or recess oxide compounds without affecting other materials. In the embodiment depicted, at least a portion of masking layer 230, such as a gate oxide layer, may remain in place over channel region 220 following recession of isolation material 210. In such embodiments, the recessing of isolation material 210 may be controlled, such as by controlling an exposure time of structure 200 to a wet oxide etchant, so that at least a portion of masking layer 230 remains unetched by the recessing of isolation material 210. Alternatively, if a first masking layer 230 is completely removed from over channel region 220 due to recession of isolation material 210, a second masking layer 230 may be formed over channel region 220 to protect an upper surface of the channel region 220 during further processing, as described below.

Figure 2B:
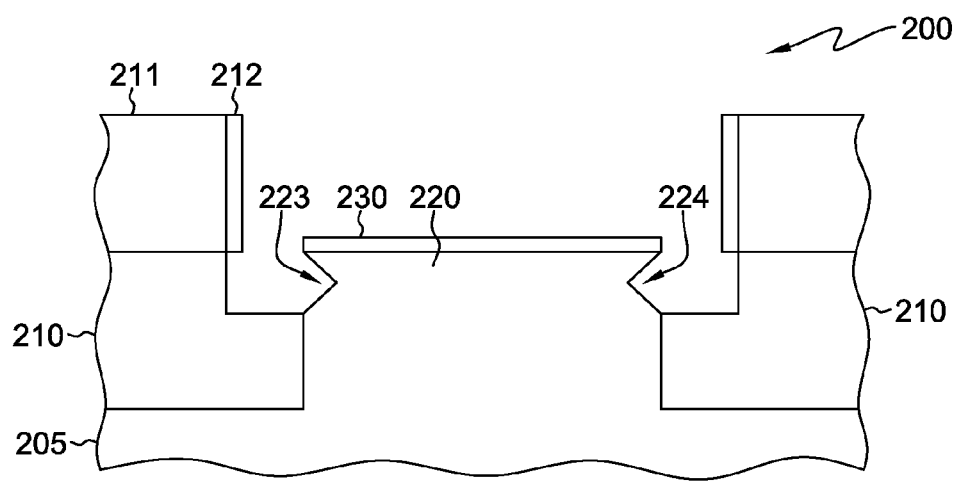

FIG. 2B depicts structure 200 of FIG. 2A following formation of an elongate notch 223 in the upper portion of the at least one channel region sidewall. In exemplary embodiments, channel region 220 may have a first channel sidewall 221 and a second channel sidewall 222, so that an elongate first notch 223 is formed in the upper portion of the first channel sidewall and an elongate second notch 224 is formed in the upper portion of the second channel sidewall. Forming of elongate notch 223, or elongate first notch 223 and elongate second notch 224, may include selectively etching the upper portion of at least one channel region sidewall with an anisotropic etchant. The masking material 230 may facilitate the etching process by protecting the upper surface of channel region 220 from the anisotropic etchant.

The anisotropic etchant used may be, for example, a wet anisotropic etchant. For example, the wet anisotropic etchant may include a hydroxide compound, such as potassium hydroxide (KOH), ammonium hydroxide ($NH_4OH$) or tetramethyl ammonium hydroxide (TMAH). Selectively etching with such a hydroxide compound may result in the elongate notch 223, or the elongate first notch 223 and elongate second notch 224, having at least one surface bounded by a (111) crystallographic plane. Hydroxide compounds such as ammonium hydroxide and TMAH may selectively etch crystalline silicon structures more rapidly along (100) and (110) crystallographic planes, but may etch silicon very slowly if the outer surface of the crystalline silicon structure is bounded by the (111) crystallographic plane. Thus, hydroxide compound etchants may selectively etch the upper portions of first channel region sidewall 221 and second channel region 222 until the etchant reaches a (111) crystallographic plane of the crystalline silicon structure, at which point the etching may slow or proactively stop, resulting in an elongate first notch 223 and elongate second notch 224 having at least one surface bound by the (111) plane. In exemplary embodiments, as illustrated by FIG. 2B, the hydroxide etchant may result in the elongate first notch 223 and elongate second notch 224 having two surfaces bound by (111) crystallographic planes. An elongate notch 223, 224 may have a greater surface area than a surface area of the upper portion of the at least one channel region sidewall 221 without the etched elongate notch. Elongate notch 223, 224 may further effectively increase a channel region 220 width and thus further increase a gate interface area with channel region 220. The increase in gate interface area with channel region 220 may further effectively reduce a threshold voltage of a gate structure, as described herein below.

Figure 2C:
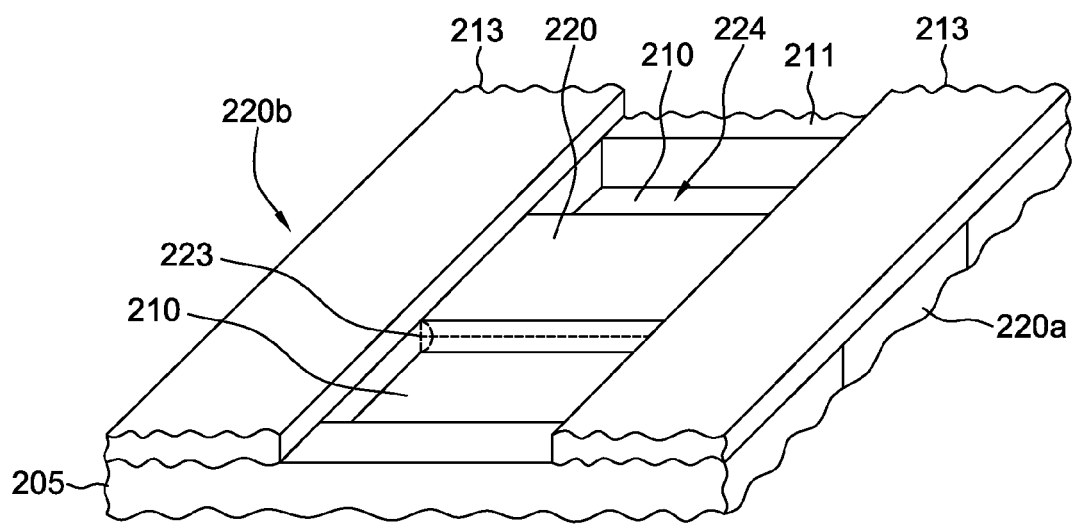

FIG. 2C depicts an isotropic view of structure 200 of FIG. 2B to provide an alternative view of elongate trench 223 formed in the upper portion of at least one channel region sidewall of channel region 210. As in FIG. 2C, first elongate trench 223 has at least one surface bounded by a (111) crystallographic plane. FIG. 2C also provides a view of source and drain regions 220a, 220b (region 220b being obscured by protective material 213) adjoining channel region 210. Source and drain regions 220a, 220b may be protected from the recessing and etching processes described herein by, for example, protective material 213 over the source and drain regions. For simplicity, and to provide a better view of channel region 220, masking material 230 is not depicted in FIG. 2C.

Figure 2D:
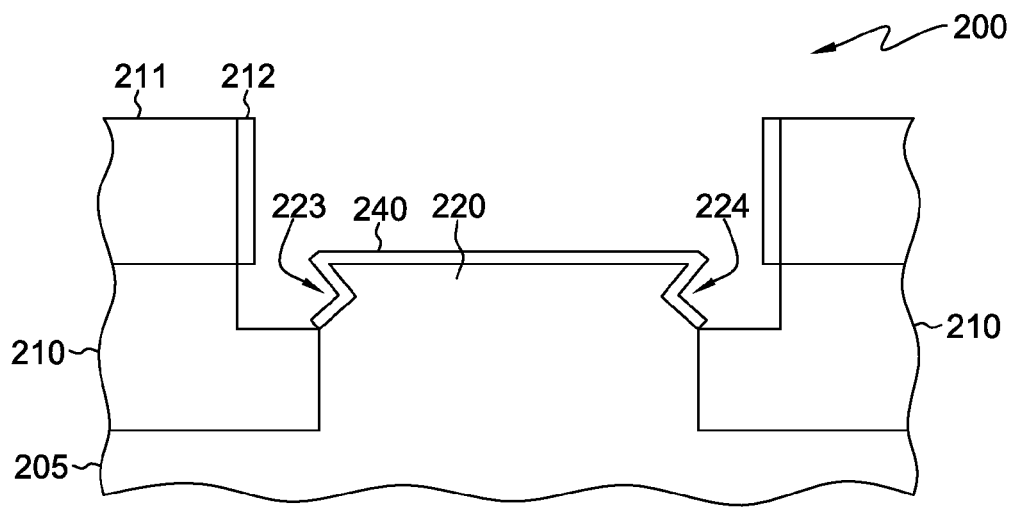

FIG. 2D depicts a cross-section view of structure 200 of FIGS. 2B and 2C following provision of at least one interface layer 240, as a gate dielectric layer, over channel region 220, as well as over elongate first notch 223 and elongate second notch 224. As described above, the at least one interface layer 240 may be provided, for example, via a controlled oxidation process that uniformly oxidizes the upper surface of channel region 220 and the first channel region sidewall 221 and second channel region sidewall 222, so that the at least one interface layer 240 conforms to the surface of elongate first trench 223 and elongate second trench 224. For example, the controlled oxidation process may include exposing structure 200 to an oxygen-containing compound in a non-oxidizing environment, so that oxidation occurs only via interaction between the material of channel region 220 and the oxygen-containing compound without additional oxidation occurring due to interactions between the material of channel region 220 and gaseous oxygen. Other methods, such as atomic layer deposition of an interface layer compound, may also or alternatively be used to form at least one interface layer 240. Additional interface layers 240, not depicted in FIG. 2D, may also be provided, such as one or more interface material layers having a high dielectric constant (high-k materials), dependent on the specific type or purpose of transistor being fabricated.

Figure 2E:
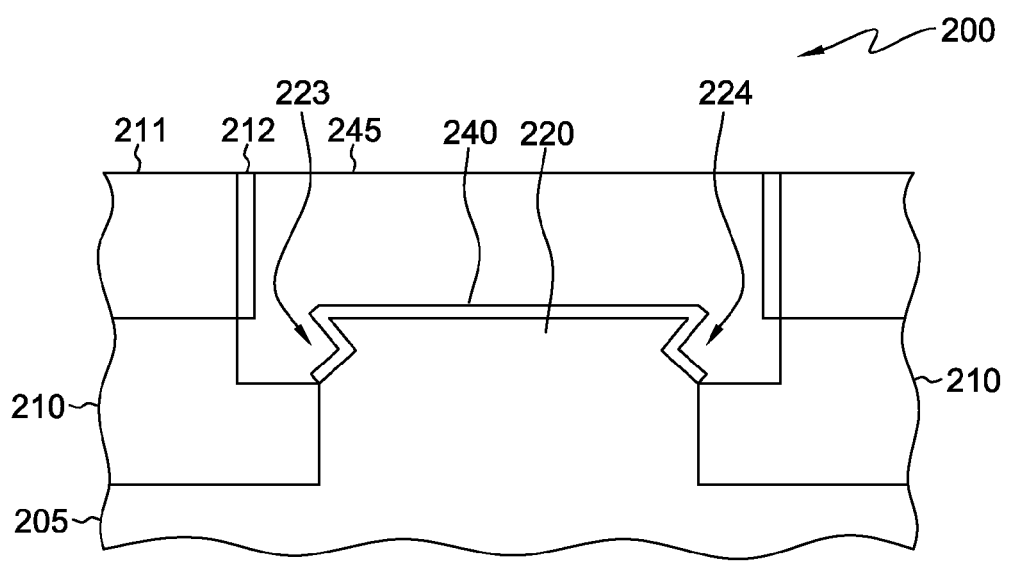

FIG. 2E depicts structure 200 of FIG. 2D following provision of a gate structure 245 over a gate interface area with channel region 220. The gate interface area with channel region 220 includes the upper portion of the at least one channel region sidewall 221, including the elongate notch 223, and an upper surface of channel region 220. The gate interface area may include the first channel region sidewall 221 and second channel region sidewall 222, as well as the upper surface of channel region 220, so that the gate interface area also includes elongate first notch 223 and elongate second notch 224. For simplicity, the embodiment of FIG. 2E depicts gate structure 245 as including a single gate structure layer, although in other embodiments gate structure 245 may include a plurality of gate structure materials or layers, such as work-function layers, capping layers, conductive metal layers, and so on. As described above, an elongate notch 223, 224 may further increase a size of the gate interface area, and thus may further effectively reduce a threshold voltage of gate structure 245. A reduction in threshold voltage may correspond to increased device performance, such as greater current flow through channel region 220. For example, a channel region 220 having an elongate first notch 223 and elongate second notch 224 may have about a 10% or higher current gain over a planar channel region without recession of isolation material 210 and without an elongate notch formed in an upper portion of a channel region sidewall. Depending on the type or purpose of planar transistor formed, the current gain provided by including elongate notches 223, 224 in the gate interface area may be greater than 20% over a planar channel region without elongate notches.

FIGS. 3A-3D depict one embodiment of a structure 300 in which at least two regions 300a, 300b of substrate 305 may have channel regions 320, 350 defined in substrate 305, and which may undergo one or more of the processes described herein to form transistors having increased gate interface areas. FIG. 3A depicts structure 300 having a first region 300a including a first channel region 320 and first masking material 330 over first channel region 320, as well as a second region 300b including a second channel region 350 and second masking material 360 over second channel region 350. The channel regions are above substrate 305 and adjacent spacer 312 and insulating material 311. FIG. 3A depicts first region 300a and second region 300b following recession of isolation material 310, exposing upper portions of first channel region 320 sidewalls 321, 322 and upper portions of second channel region 350 sidewalls 351, 352. The isolation material 310 may include an oxide compound in exemplary embodiments. Isolation material 310 in first region 300a and second region 300b may, in exemplary embodiments, be recessed via the same recessing process, such as via a wet oxide etchant that selectively recesses oxide compounds without affecting other materials, such as nitride spacers 312 and first and second channel regions 320, 350. As those with skill in the art will understand, substrate 305 may have any number of channel regions defined therein, and any number of transistors may be formed according to the methods disclosed herein that include said channel regions.

FIG. 3B depicts structure 300 following provision of a protective material 315 over first channel region 300a. Protective material 315 may be any material, such as a layer of photo-resist material, which may be resistant to anisotropic etchants used, for example, to form elongate notches in second channel region 350, as described further below. First region 300a may be selectively covered by protective material 315 to leave second region 300b exposed, as illustrated in FIG. 3B. In alternative embodiments in which more than two transistors are fabricated, protective material 315 may be selectively deposited over any number of channel regions, such as channel region 320, to protect those channel regions from exposure to etchant materials, while other channel regions like channel region 350 may be left exposed.

FIG. 3C depicts structure 300 following formation of an elongate first notch 353 and elongate second notch 354 in upper portions of the sidewalls of second channel region 350. Elongate first notch 353 and elongate second notch 354 may be formed by selectively etching the upper portion of at least one channel region sidewall with a wet anisotropic etchant, such as a hydroxide compound (e.g., potassium hydroxide, ammonium hydroxide, TMAH). As previously described, use of a hydroxide compound anisotropic etchant may result in elongate first notch 353 and elongate second notch 354 each having at least one surface bounded by a (111) crystallographic plane. Channel region 320 in first region 300a may remain unaffected by exposure of structure 300 to anisotropic etchants due to protective material 315 over first region 300a.

FIG. 3D depicts structure 300 following removal of protective material 315 from over first region 300a. In exemplary embodiments in which protective material 315 is a photoresist material, the protective material may be removed by a wet photoresist stripper or a dry photoresist etching technique. Structure 300 may undergo further processing to remove remaining masking material 330, 360 and form interface layers (not depicted in FIG. 3D) over channel regions 320, 350 as well as form gate structures over channel regions 320, 350. A first transistor formed in first region 300a may have a gate interface area between a gate structure and first channel region 320 including upper portions of first channel region sidewalls, and a second transistor formed in second region 300b may have a gate interface area between a gate structure and second channel region 350 including elongate notches 353, 354 in upper portions of second channel region sidewalls.

Each of the transistors formed in regions 300a and 300b may have an effectively reduced threshold voltage due to the increased gate interface areas of the respective gate structures, resulting from the increase in effective channel region widths. In one embodiment, the formation of elongate notches 353, 354 in the second channel region 350, and recessing isolation material 310 to expose upper portions of the first channel region 320 without forming elongate notches in the first channel region 320 sidewalls, may compensate, for instance, for variations in size between channel regions 320 and 350, and may effectively reduce a threshold voltage differential between transistors formed in regions 300a and 300b. Reducing the threshold voltage differential between the transistors may also effectively reduce a minimum threshold voltage for the transistors. This may allow for the transistors to be operated at a lower voltage overall, reducing junction leakage and energy waste for the transistors.

As those with skill in the art may understand, the example of FIGS. 3A-3D may be applied to any number of channel regions defined in a substrate for any number of transistors to effectively reduce threshold voltage differentials between transistors and reduce a minimum threshold voltage for the transistors. In addition, in some embodiments, some selected channel regions may be protected, as by a photo-resist protective material, to prevent recession of isolation material 310 adjoining the selected channel regions as well as prevent etching of elongate notches in the selected channel regions' sidewalls. This may further facilitate reducing threshold voltage differentials between transistors, depending on the properties of the channel regions and transistors being formed.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   facilitating fabricating a transistor, the facilitating fabricating comprising:
   defining a channel region in a substrate, the channel region having at least one channel region sidewall adjoining an isolation material;
   recessing the isolation material, the recessing exposing an upper portion of the at least one channel region sidewall;
   forming an elongate notch in the upper portion of the at least one channel region sidewall, the elongate notch increasing a surface area of the at least one channel region sidewall;
   providing a gate structure over a gate interface area with the channel region, the gate interface area comprising at least the upper portion of the at least one channel region sidewall and an upper surface of the channel region, the gate extending within the elongate notch; and
   wherein the gate interface area comprising the upper portion of the at least one channel region sidewall reduces a threshold voltage of the gate structure.

2. The method of claim 1, further comprising providing at least one interface layer on the gate interface area of the channel region to electrically isolate the channel region from the gate structure.

3. The method of claim 1, wherein the isolation material comprises an oxide compound, and the recessing comprises a wet oxide recessing process.

4. The method of claim 1, wherein the at least one channel region sidewall is a first channel region sidewall, the isolation material is a first portion of the isolation material, and the channel region further comprises a second channel region sidewall adjoining a second portion of the isolation material, and wherein the recessing further comprises recessing the second portion of the isolation material to expose an upper portion of the second channel region sidewall, the gate interface area further comprising the upper portion of the second channel region sidewall.

5. The method of claim 1, wherein forming the elongate notch comprises selectively etching the upper portion of the at least one channel region sidewall with an anisotropic etchant.

6. The method of claim 5, wherein the anisotropic etchant comprises a hydroxide compound.

7. The method of claim 5, wherein the selectively etching results in the elongate notch having at least one surface bounded by a (111) crystallographic plane.

8. The method of claim 5, further comprising providing a masking material over the upper surface of the channel region, the masking material facilitating selectively etching the upper portion of the at least one channel region sidewall without etching the upper surface of the channel region.

9. The method of claim 8, wherein the masking material comprises an oxide compound.

10. The method of claim 5, wherein the at least one channel region sidewall is a first channel region sidewall, the isolation material is a first portion of the isolation material, the elongate notch is an elongate first notch, and the channel region further comprises a second channel region sidewall adjoining a second portion of the isolation material, and wherein the recessing further comprises recessing the second portion of the isolation material to expose an upper portion of the second channel region sidewall, and the selectively etching further comprises selectively etching the upper portion of the second channel region sidewall to form an elongate second notch in the second channel region sidewall, and the gate interface area further comprises the upper portion of the second channel region sidewall.

11. The method of claim 10, wherein the selectively etching results in the elongate second notch having at least one outer surface bounded by a (111) crystallographic plane.

12. The method of claim 1, wherein the transistor is one transistor of a plurality of transistors, and wherein reducing the threshold voltage of the gate structure of the one transistor reduces a threshold voltage differential between the one transistor and at least one other transistor of the plurality of transistors.

13. The method of claim 12, wherein reducing the threshold voltage differential between the one transistor and the at least one other transistor of the plurality of transistors further reduces a minimum threshold voltage for the plurality of transistors.

14. The method of claim 1, wherein the transistor comprises a planar transistor structure.

* * * * *